United States Patent
Belady et al.

(10) Patent No.: US 7,558,063 B2
(45) Date of Patent: Jul. 7, 2009

(54) SERVER WITH A FLEXIBLE COOLING SCHEME

(75) Inventors: Christian L. Belady, Mckinney, TX (US); Eric C. Peterson, McKinney, TX (US); David M. Chastain, Austin, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 234 days.

(21) Appl. No.: 11/740,624

(22) Filed: Apr. 26, 2007

(65) Prior Publication Data

US 2008/0266790 A1    Oct. 30, 2008

(51) Int. Cl.
H05K 7/20 (2006.01)
H05K 5/00 (2006.01)
A47B 77/08 (2006.01)

(52) U.S. Cl. ........................ 361/696; 361/687; 361/695; 361/698; 361/699; 361/701; 454/184; 312/236; 165/80.3

(58) Field of Classification Search ................. 361/687, 361/695, 696, 698, 699, 701; 454/184; 165/80.3; 312/236
See application file for complete search history.

(56) References Cited

U.S. PATENT DOCUMENTS

| | | | |
|---|---|---|---|
| 5,634,351 A | 6/1997 | Larson et al. | |
| 6,164,369 A * | 12/2000 | Stoller | 165/104.33 |
| 6,166,907 A | 12/2000 | Chien | |
| 6,313,990 B1 | 11/2001 | Cheon | |
| 6,333,849 B1 | 12/2001 | Donahoe et al. | |
| 6,826,046 B1 * | 11/2004 | Muncaster et al. | 361/687 |
| 7,211,742 B2 * | 5/2007 | Moore et al. | 174/539 |
| 2004/0100770 A1 * | 5/2004 | Chu et al. | 361/698 |
| 2004/0240178 A1 | 12/2004 | Kim et al. | |

* cited by examiner

Primary Examiner—Jayprakash N Gandhi
Assistant Examiner—Zachary M Pape

(57) ABSTRACT

A server with a flexible cooling scheme is disclosed. The server comprises a case and a fan. When the server is in a first cooling configuration the fan is configured to force the gas past a first area to be cooled and out to the outside of the case through a second opening in the case. When the server is in a second cooling configuration, the server further comprises a heat exchanger located in the first area and configured to seal the first opening in the case thereby preventing outside gas from entering the first area. When the server is in the second cooling configuration, a sealing device is configured to seal the second opening thereby redirecting the first fan to force the gas past the first area to be cooled and back into the first area, thereby re-circulating the gas inside the case.

16 Claims, 4 Drawing Sheets

SERVER WITH A FLEXIBLE COOLING SCHEME

BACKGROUND

Data centers and other locations that contain a number of servers may have problems with the high heat density in the servers. Currently, most servers are air or gas cooled. However, in the future it seems likely that many servers will switch to a liquid cooling architecture. Currently, systems are either designed for air cooling or liquid cooling. A customer must decide up front which type of cooling will be used. When a customer starts with an air cooled architecture and then adds additional servers to the system, the heat density may increase such that liquid cooling is required. In this case all the air cooled servers may need to be replaced with servers using a liquid cooled architecture. Because servers are designed as either air or liquid cooled, manufactures may need to stock two different models for each type of server they supply. The additional inventory is costly for the manufacture. In this application, the terms air cooled and gas cooled are considered equivalent.

DETAILED DESCRIPTION

Figure 1:
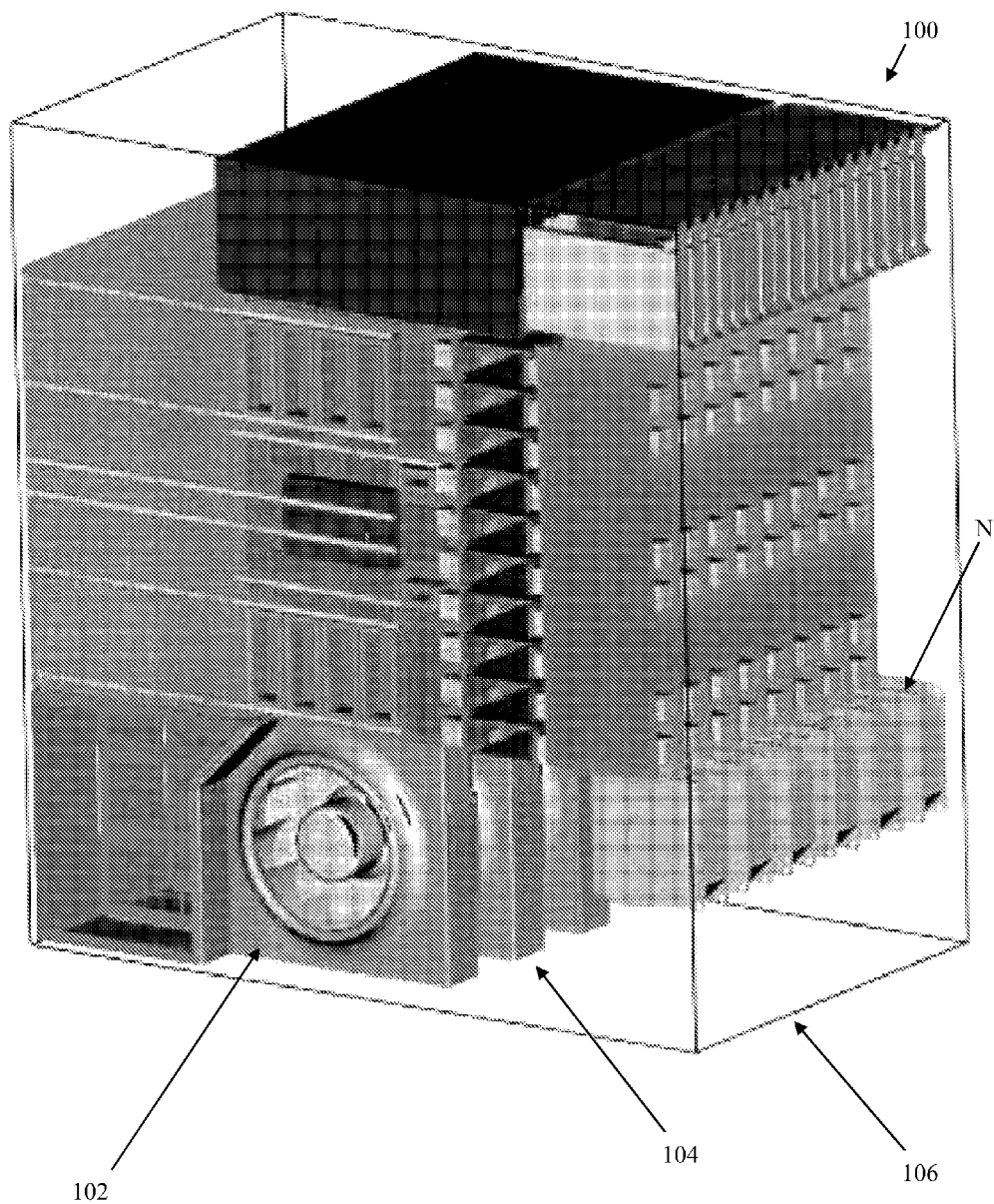
FIG. 1. is an isometric cutaway view of a server 100 in an example embodiment of the invention.
Figure 2A:
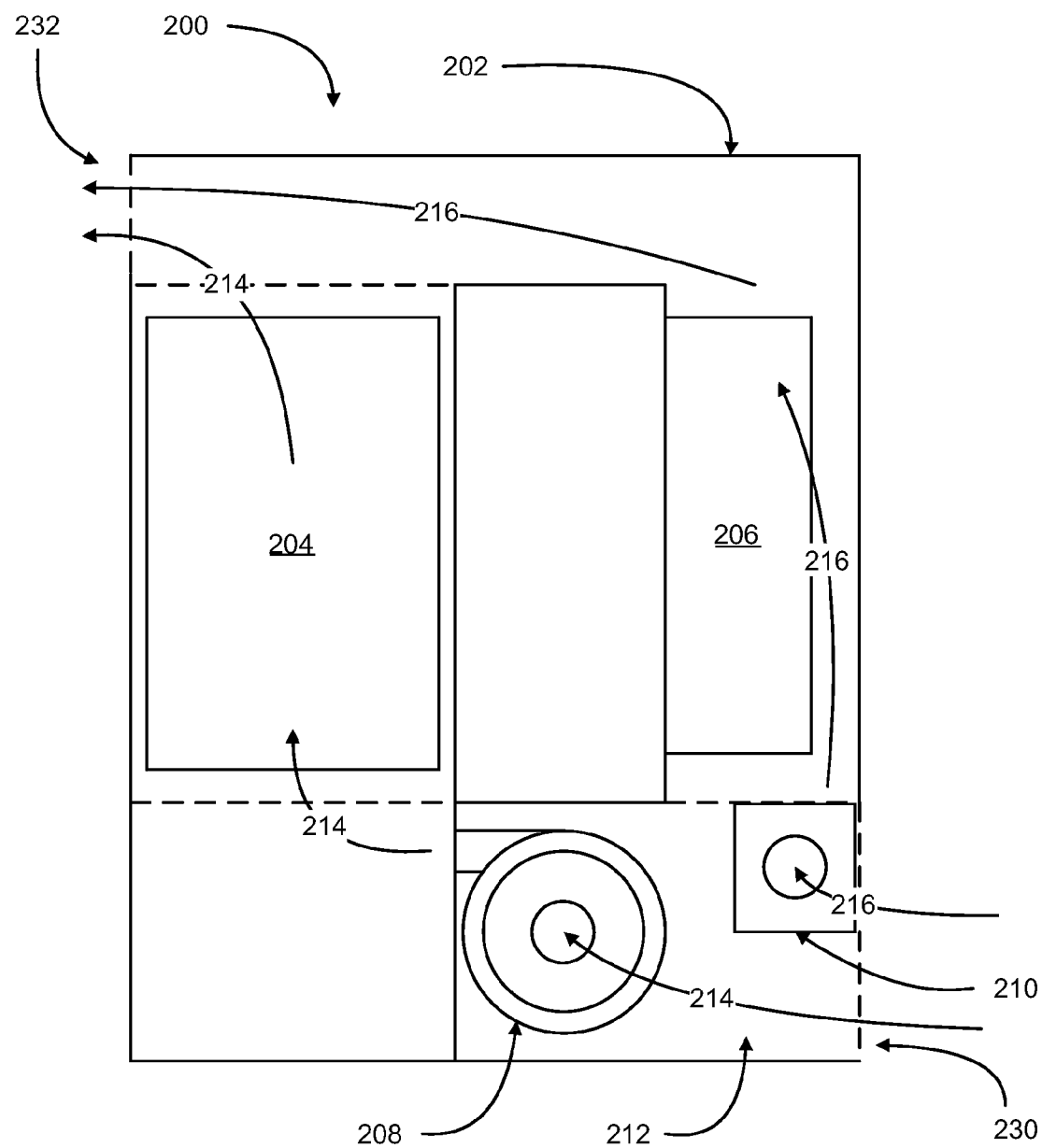
FIG. 2*a*. is a block diagram of a server 200 in a first cooling configuration in an example embodiment of the invention.
Figure 2B:
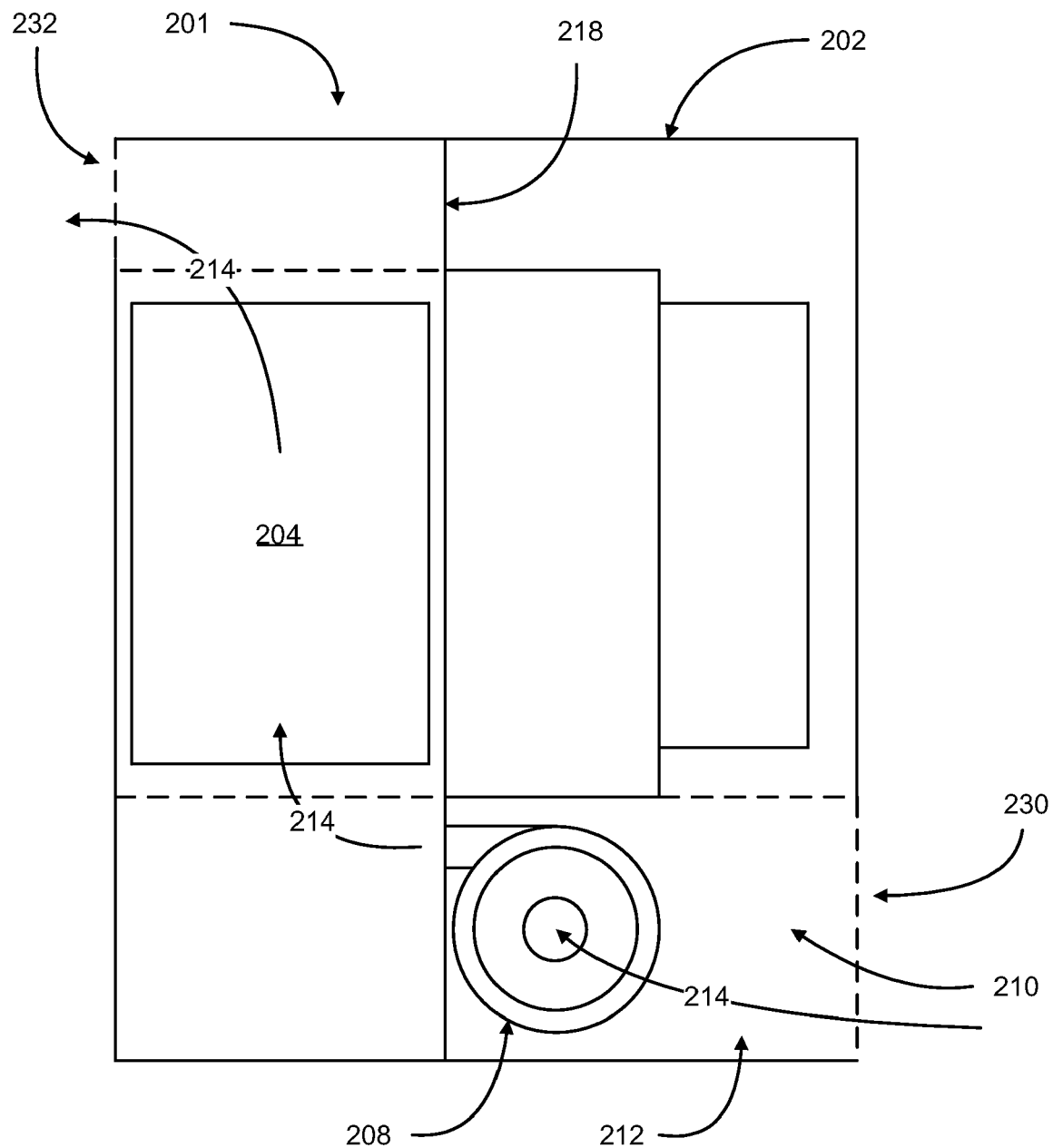
FIG. 2*b*. is a block diagram of a server 201 in a first cooling configuration in an alternate example embodiment of the invention.
Figure 3:
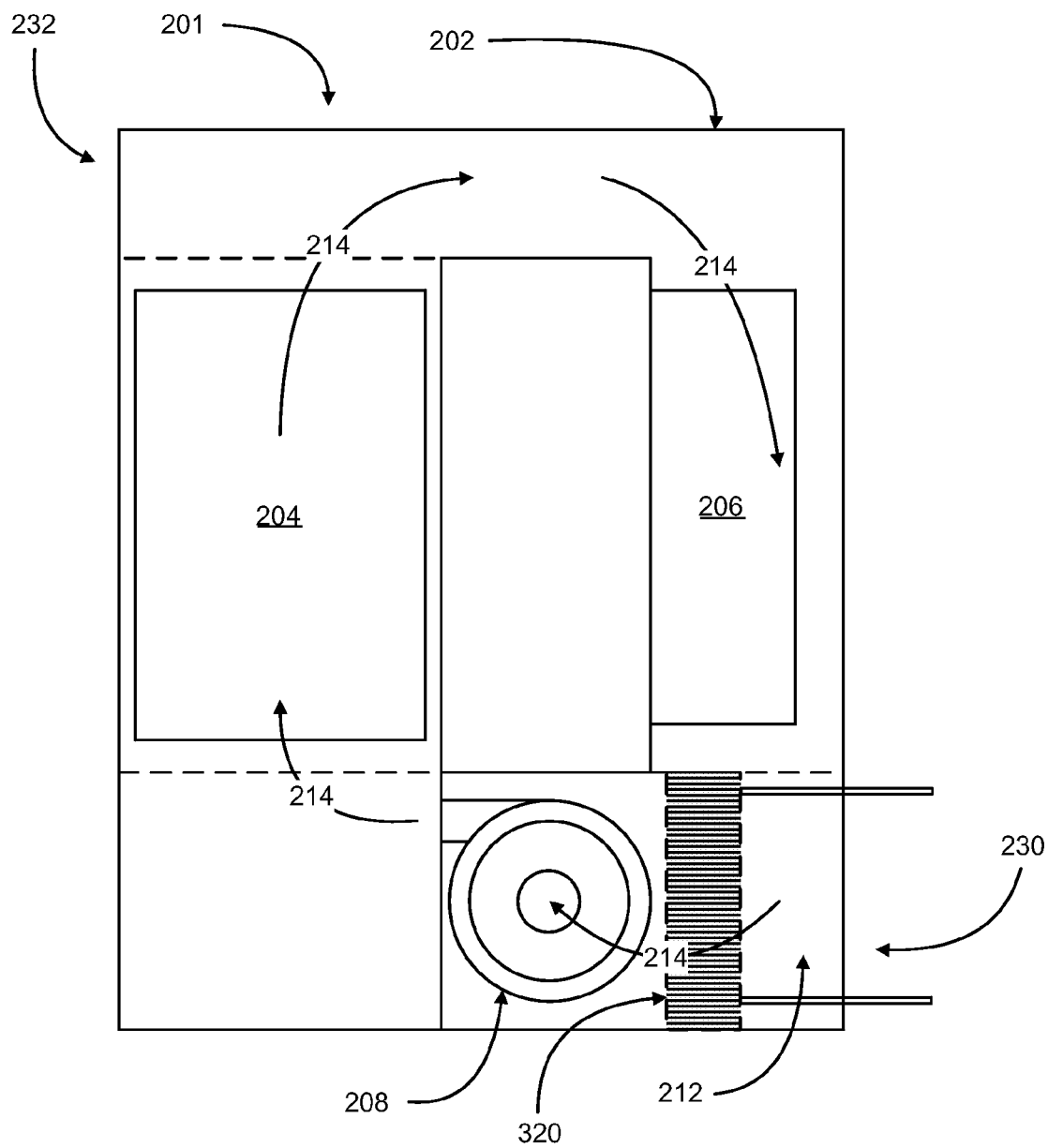
FIG. 3. is a block diagram of server 200 in a second cooling configuration in an example embodiment of the invention.

FIGS. 1-3 and the following description depict specific examples to teach those skilled in the art how to make and use the best mode of the invention. For the purpose of teaching inventive principles, some conventional aspects have been simplified or omitted. Those skilled in the art will appreciate variations from these examples that fall within the scope of the invention. Those skilled in the art will appreciate that the features described below can be combined in various ways to form multiple variations of the invention. As a result, the invention is not limited to the specific examples described below, but only by the claims and their equivalents.

FIG. 1 is an isometric cutaway view of a server 100 in an example embodiment of the invention. Server 100 comprises a case 106, and a plurality of blades, 102, 104 . . . up to N, mounted inside case 106. Each blade may contain a cooling system for that blade. The cooling system for one blade may be configured to provide cooling for adjacent blades in the event of a fan failure. Each blade may contain one or more areas that require cooling.

FIG. 2*a* is a block diagram of a server 200 in a first cooling configuration in an example embodiment of the invention. Server 200 comprises a case 202, a first fan 208, a second fan 210, a first area that requires cooling 204 and a second area that requires cooling 206. The first fan 208 and second fan 210 are mounted inside chamber, volume or area 212 and are configured to draw air into chamber, volume or area 212 through a first opening 230 in case 202. The first fan 208 is configured to force the air past the first area that requires cooling 204 and out of the case 202 through a second opening 232 in case 202. The second fan 210 is configured to force the air past the second area that requires cooling 206 and out of the case 202 through the second opening 232 in case 202. Air flow from the first fan is shown by arrows 214. Air flow from the second fan is shown by arrows 216. Opening 232 may take any form including slots formed in case 202, a louvered grill, a replaceable plate with slots or openings formed in the plate, or the like. In one example embodiment of the invention, the first fan 208 is considered to be a permanent fan and the second fan 210 is considered to be a removable fan.

FIG. 3 is a block diagram of server 200 in a second cooling configuration in an example embodiment of the invention. In the second cooling scheme, server 200 comprises a case 202, a first fan 208, a heat exchanger 320, a first area that requires cooling 204 and a second area that requires cooling 206. Openings 230 and 232 have been closed or sealed. The second fan 210 has been replaced with heat exchanger 320. In operation, fan 208 draws air from chamber, volume or area 212, past heat exchanger 320. Fan 208 forces the cooled air past the first area that requires cooling 204, past the second area that requires cooling 206, and then back into chamber, volume or area 212, thereby creating a recirculation path for the air. The airflow from the fan 208 is shown by arrows 214. The coolant for the heat exchanger can be air, compressed air, refrigerant, $CO_2$, water or any other fluid used for cooling.

In one example embodiment of the invention, heat exchanger is configured to block or seal opening 230 when installed. Opening 232 may be blocked or sealed using any method including attaching a blank plate, locking shut the louvered opening, plugging the holes using a plug, or the like.

By having a server that can be configured for either air or liquid cooling, a manufacturer can reduce the number of stocking units, thereby reducing inventory cost. A user may also be able to switch cooling configurations in the field, reducing the need to replace installed servers when additional servers are added to a system.

In one example embodiment of the invention, the second fan 216 may be mounted inside chamber 212 as part of an air cooling module. When switching between cooling configurations, the air cooling module may be replaced with a liquid cooling module that contains heat exchanger 320 and is configured to block opening 230.

To switch from the air cooling scheme to the liquid cooling scheme, the second fan 210 would be removed and replaced with heat exchanger 320. Opening 232 would be closed or sealed to create a re-circulating air pathway inside case 202.

In some example embodiments of the invention, some areas in the server may require more cooling than other areas. For example area 204 may require more cooling than area 206. The air flow in the recirculation path may be configured such that the area that requires the most cooling is the first area that is reached in the air flow path after the air passes the heat exchanger. By locating the area that requires the most cooling as the first location in the air flow path, the air will be the coolest and remove the most heat from the area that requires the most cooling.

FIG. 2*b* is a block diagram of a server 201 in a first cooling configuration in an alternate example embodiment of the invention. Server 201 may have only one area 204 that requires cooling. Sever 201 comprises case 202, fan 208, and an area that requires cooling 204. In operation, fan 208 is mounted inside chamber 212 and is configured to draw air into chamber 212 through a first opening 230 in case 202. The fan 208 is configured to force the air past the area that requires cooling 204 and out of the case 202 through a second opening 232 in case 202. Plate or blocking member 218 force air out through opening 232 and prevents air from flowing back into chamber 212. Plate or blocking member 218 may be configured to move from a first location (as shown) to a second location adjacent to opening 232. In the second location (not shown) plate or blocking member 218 is configured to block or seal opening 232. Plate or blocking member may use a sliding motion or a rotation during displacement between the first location and the second location.

When server 201 is switched into the second cooling scheme or configuration (see FIG. 3), heat exchanger 320 is installed into chamber 212, sealing opening 230, and plate or blocking member 218 is moved from the first location to the second location.

In another example embodiment of the invention, when server 201 is switched into the second cooling scheme or configuration, a heat exchanger is installed into chamber 212 such that opening 230 remains open, and blocking member 218 remains in the first location. In this configuration, air is still drawn into chamber 212 from outside the server, but the outside air is cooled by the heat exchanger before being forced over the area to be cooled.

What is claimed is:

1. A server with a flexible cooling scheme, comprising:
    a case having an inside and an outside;
    a first fan positioned inside the case and configured to draw gas from a first area inside the case and force the gas past a first area to be cooled;
    a first opening in the case configured to allow gas from outside the case to enter the first area;
    when the server is in a first cooling configuration the first fan is configured to force the gas past the first area to be cooled and out to the outside of the case through a second opening in the case;
    when the server is in a second cooling configuration, the server further comprises:
        a heat exchanger located in the first area and configured to seal the first opening in the case thereby preventing outside gas from entering the first area;
        a sealing device configured to seal the second opening thereby redirecting the first fan to force the gas past the first area to be cooled and back into the first area, thereby re-circulating the gas inside the case.

2. The server with a flexible cooling scheme of claim 1, wherein when the server is in the first cooling configuration, the server further comprises:
    a second fan positioned inside the case and configured to draw gas from the first area and force the gas past a second area to be cooled and then out to the outside of the case through the second opening in the case.

3. The server with a flexible cooling scheme of claim 2, wherein the second fan is mounted in an air cooling module that is configured to replace a liquid cooling module that has the heat exchanger mounted therein when switching from the second cooling configuration to the first cooling configuration.

4. The server with a flexible cooling scheme of claim 2, wherein the first area to be cooled requires more cooling than the second area to be cooled.

5. The server with a flexible cooling scheme of claim 1, wherein when the server is in the first cooling configuration, the server further comprises:
    a blocking plate configured to direct the gas from the first fan out through the second opening in the case and prevent the gas from flowing back into the first area.

6. The server with a flexible cooling scheme of claim 5 wherein the blocking plate can be moved from a first location to a second location where at the second location the blocking plate closes the second opening and redirects the flow of gas from the first fan back into the first area.

7. The server with a flexible cooling scheme of claim 6 wherein the blocking plate can be moved from a first location to a second location using a motion selected from the group consisting of a sliding motion and a rotation.

8. A method for reconfiguring the cooling scheme in a server, comprising:
    installing a heat exchanger into the server wherein the heat exchanger is configured to seal off a first area inside the case from air outside the case;
    sealing an opening in the case that was configured to allow air, forced from a permanent fan, to exit the case, wherein the permanent fan is configured to draw air from the first area inside the case, past the heat exchanger, force the air past an area to be cooled, and force the air back into the first area, once the opening has been sealed.

9. The method for reconfiguring the cooling scheme in a server of claim 8, further comprising:
    removing a removable fan from the first area inside a case and replacing the removable fan with the heat exchanger.

10. The method for reconfiguring the cooling scheme in a server of claim 8 wherein the removable fan is mounted in an air cooling module that is configured to be replaced by a liquid cooling module that has the heat exchanger mounted therein when switching from the first cooling configuration to the second cooling configuration.

11. The method for reconfiguring the cooling scheme in a server of claim 8 wherein the second opening is sealed by moving a blocking plate from a first location to a second location.

12. A method of manufacturing a server with a flexible cooling scheme, comprising:
    positioning a first fan inside a case wherein the first fan is configured to draw gas from a first volume inside the case;
    opening a first and a second passageway through the case wherein the first passageway opens into the first volume, allowing the first fan to draw gas through the first passageway into the first volume, force the gas past a first area to be cooled, and force the gas out through the second passageway, when the server is in a first cooling configuration;
    installing a heat exchanger inside the case in the first volume wherein the first fan is configured to draw gas from the first volume past the heat exchanger, force the gas past a first area to be cooled, and back into the first chamber, when the server is in a second cooling configuration.

13. A method of manufacturing a server with a flexible cooling scheme, comprising:
    positioning a first fan inside a case wherein the first fan is configured to draw gas from a first compartment inside the case and force the gas past a first area to be cooled;
    forming a first opening in the case configured to allow gas from outside the case to enter the first compartment;
    allowing the first fan to force the gas past the first area to be cooled and out to the outside of the case through a second opening in the case when the server is in a first cooling configuration;
    when the server is in the first cooling configuration, the server further comprises:
        a second fan positioned inside the case and configured to draw gas from the first compartment and force the gas, in a first direction, past a second area to be cooled and then out to the outside of the case through the second opening in the case;

when the server is in a second cooling configuration, the server further comprises:
- a heat exchanger located in the first compartment and configured to seal the first opening in the case thereby preventing outside gas from entering the first compartment;
- a sealing device coupled to the case and configured to seal the second opening thereby redirecting the first fan to force the gas past the second area to be cooled, in the opposite direction from the first direction, and back into the first compartment, thereby re-circulating the gas inside the case.

14. The method of manufacturing a server with a flexible cooling scheme of claim 13, wherein the second fan is mounted in an air cooling module that is configured to replace a liquid cooling module that has the heat exchanger mounted therein when switching from the second cooling configuration to the first cooling configuration.

15. A server with a flexible cooling scheme, comprising:
a case having an inside and an outside;
means for drawing gas from a first area inside the case and forcing the gas past a first area to be cooled;
means for allowing gas from outside the case to enter the first area;
when the server is in a first cooling configuration the means for drawing gas from a first area is configured to force the gas past the first area to be cooled and out to the outside of the case through a second opening in the case;
when the server is in a second cooling configuration, the server further comprises:
- means for liquid cooling air located in the first area wherein the means for liquid cooling air is configured to seal the first opening in the case thereby preventing outside gas from entering the first area;
- means for sealing the second opening thereby redirecting the means for drawing gas to force the gas past the first area to be cooled and back into the first area, thereby re-circulating the gas inside the case.

16. A server with a flexible cooling scheme, comprising:
a case having an inside and an outside;
a first fan positioned inside the case and configured to draw gas from a first area inside the case and force the gas past a first area to be cooled;
a first opening in the case configured to allow gas from outside the case to enter the first area;
when the server is in a first cooling configuration the first fan is configured to force the gas past the first area to be cooled and out to the outside of the case through a second opening in the case;
when the server is in a second cooling configuration, the server further comprises:
- a heat exchanger located in the first area and positioned such that air drawn through the first opening is drawn through the heat exchanger before being forced past the first area to be cooled.

* * * * *